United States Patent [19]

Lofmark

[11] 4,092,499
[45] May 30, 1978

[54] APPARATUS FOR DETECTING A VOICE FREQUENCY SIGNAL

[75] Inventor: Bengt Gustav Lofmark, Skarholmen, Sweden

[73] Assignee: Telefonaktiebolaget L M Ericsson, Stockholm, Sweden

[21] Appl. No.: 722,273

[22] Filed: Sept. 10, 1976

[30] Foreign Application Priority Data

Oct. 3, 1975 Sweden .................................. 7511126

[51] Int. Cl.² ............................................ H04M 1/50
[52] U.S. Cl. ................................................ 179/84 VF
[58] Field of Search ............... 179/84 VF, 84 R, 2 A; 307/233

[56] References Cited

U.S. PATENT DOCUMENTS 3,501,703 3/1970 Baade ............................. 179/84 VF
3,593,275 7/1971 Phmpe ............................ 179/84 VF Primary Examiner—Kathleen H. Claffy
Assistant Examiner—Joseph A. Popek
Attorney, Agent, or Firm—Hane, Roberts, Spiecens & Cohen

[57] ABSTRACT

An apparatus for detection of a tone signal having a predetermined frequency among other tone signals, includes a combined band reject-band pass filter, amplitude limiting means and a product modulator. The signals appearing across the two outputs of the filter have different phases if an input signal has a frequency equal to the tone signal frequency. The value of the phase difference is converted to a DC-component by the limiting means and the modulator, and the magnitude of the DC-component forms an indication of the desired tone signal.

4 Claims, 8 Drawing Figures

APPARATUS FOR DETECTING A VOICE FREQUENCY SIGNAL

The present invention relates to apparatus for the detection of a tone signal used for signalling purpose, the frequency of which is situated within the range of a voice frequency band, a so called in-band signal.

The apparatus according to the invention is mainly used when receiving in-band signals between two telephone exchanges, the signals being used as calling signals, release signals, and so on.

When receiving in-band signals, it is necessary that the signal receiver shows so-called "circuit protection", i.e. the receiver should be activated only when the signalling frequency appears alone. When the tone signal used for the signalling whose frequency is situated within a voice frequency band appears together with other tone signals within the band, the signal receiver thus should not accept the tone as a signalling tone.

A previously known apparatus for obtaining said "circuit protection" of a signal receiver is illustrated in FIG. 1 of the accompanying drawings. The signal appearing across the terminal I contains the signalling frequency $fo$ together with one or more tone frequency signals with the frequencies $f1$, $f2$ and so on. In the band-reject filter 1 whose stop band is situated around the frequency $fo$, the signal frequency but not other frequencies is attenuated. In the limiting circuit 2 a suppression of the composite signal occurs and, in addition, an attenuation of the signals which do not contain the signalling frequency $fo$ takes place in the bandpass filter 3 having its passband around the frequency $fo$. If a signal having the signalling frequency together with one or more tone signals appears across the input terminal I, then an insufficient output signal is obtained from the rectifier 4 is obtained. If, on the contrary, the signal frequency $fo$ appears alone across the terminal I a sufficiently high output signal from the rectifier is obtained which can be utilized as a criterion that only the signalling frequency has been received.

This known arrangement certainly gives an immediate "circuit protection", i.e. the arrangement does not contain any inherent time constant. The drawback, however, is that two independent filter circuits are necessary and, in addition, that an incoming tone signal whose frequency is a submultiple of the signalling frequency, after limitation, also includes the signalling frequency, so that a DC-voltage is obtained from the rectifier. There is thus the risk that a signal which contains a submultiple of the signalling frequency together with associated harmonics can give an undesired output signal, since the submultiple signal as well as some of its harmonics contribute to a DC-component.

An object of the present invention is to provide a voice frequency detecting apparatus, which contains only one tuned circuit and which shows an immediate "circuit protection" for the frequency of an incoming in-band signal and in a narrow frequency band of the same.

The invention, the characteristics of which appear from the appended claims, will be described more fully in connection with the accompanying drawings, in which:

Figure 1:
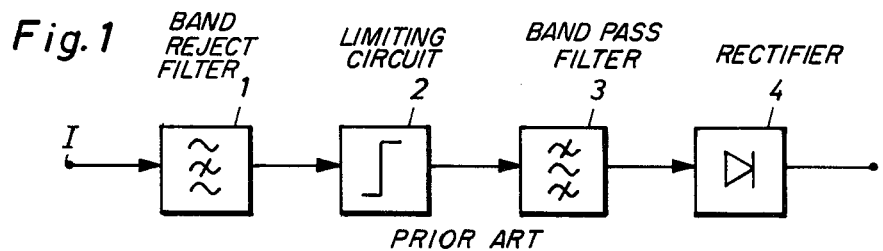
FIG. 1 shows a block diagram of an arrangement for the detection of an in-band signal as described above.
Figure 2:
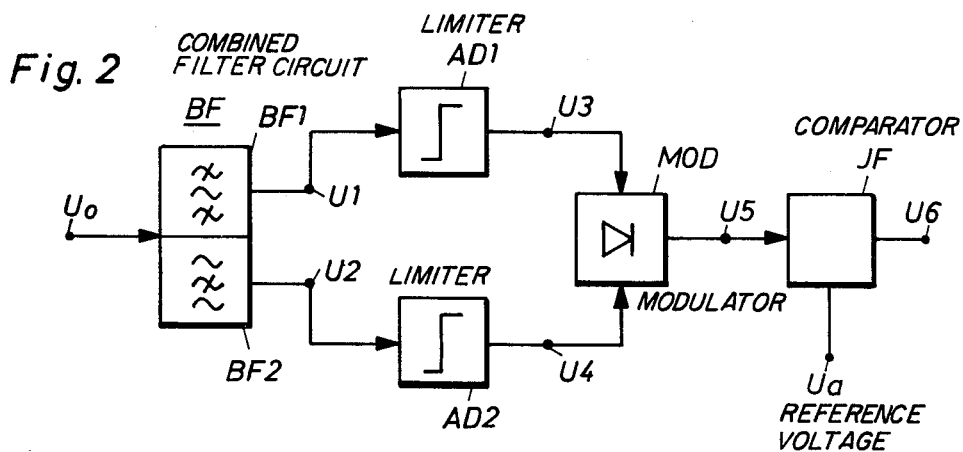
FIG. 2 shows a block diagram of an apparatus for detection of an in-band signal according to the present invention.

In FIG. 2 a block diagram of the arrangement according to the invention is shown. A selective circuit in the form of a combined filter circuit for the desired tone signal is designated BF, the input Uo of the circuit receiving an incoming signal. This signal can consist of several speech frequencies together with the signalling frequency when speech information is transferred, or it can consist of only the signalling frequency $fo$ when signalling information is transferred. The block BF consists of two part circuits BF1 and BF2 with the part circuit BF1 consisting of a filter circuit of band pass or all pass character. In the case of a band pass character filter, the center of the pass band coincides with the signalling frequency $fo$. The other part circuit BF2 consists of a filter circuit with band reject character, the reject frequency of the filter coinciding with the signalling frequency $fo$. Across the band reject output U2, there appears thus a signal in which the signalling component $fo$ is suppressed in relation to the other components within the voice frequency band. Across the band pass output U1 a signal is obtained in which instead said components are suppressed in relation to the signalling component. In the combined filter circuit BF, in addition, a mutual phase shift of the signals across the output U1 and U2 is obtained. The level of such signals is limited in the amplitude limiters AD1 and AD2, and the thus obtained in-the-main-rectangular shaped signals are supplied to the two inputs of a product modulator MOD. The output signal across the output U5 of the modulator MOD, thus, consists of the product of the rectangular shaped signals across the outputs U3 and U4 of the limiters AD1, AD2.

In the case mentioned above, when the input signal across the input Uo contains the components with the frequencies $f1, f2$ and so on together with the signalling component with the frequency $fo$, a phase shift between the signals across the output U1 and U2 is obtained. After conversion to rectangular shape in the limiters AD1 and AD2 and modulation in the product modulator MOD, a signal across the output U5 is obtained which contains a DC-component, whose magnitude is dependent on this phase shift and on the suppression of the signalling component in the part circuit BF2. If, on the contrary, the input signal across the input Uo only contains the signalling component with the frequency fo, the mutual phase shift between the signals across the output U1 and U2 is equal zero and a maximum DC-component in the signal across the output U5 appears, since the product of two tone signals equal in phase is obtained. The presence of a DC-component in the output signal from the modulator MOD, obviously, can be utilized as a criterion that only the signalling component appears across the input Uo. For this purpose a comparator JF is with one input connected to the output U5 of the modulator MOD and a constant DC-voltage Ua is connected to the other input of the comparator JF. If then the DC-component of the signal appearing across the output U5 exceeds the level determined by the DC-voltage Ua, an output magnitude across the output of the comparator is obtained, the polarity of which indicates that the incoming tone signal should be accepted as a signalling tone. If, on the contrary, the DC-component falls below said such level, a received tone signal should not be accepted as a signalling tone. The comparator JF consists, for example, of an operational amplifier of known kind.

Figure 3:
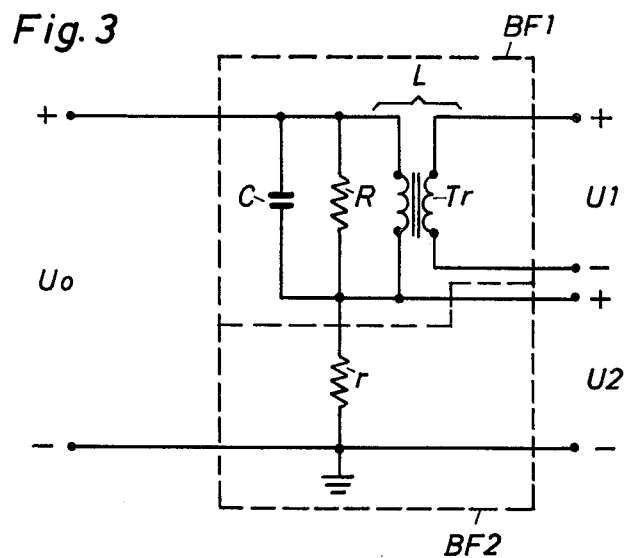
FIG. 3 shows a circuit diagram of a combined filter circuit with one input and two outputs which show a bandpass and a band-reject character, respectively, which circuit is included as an essential part in the apparatus according to FIG. 2.

FIG. 3 shows a circuit diagram of a possible embodiment of the combined filter circuit BF according to FIG. 2. The first part circuit BF1 consists of a parallel resonance circuit, the resonance frequency of which is equal to the chosen signalling frequency fo. The parallel resonant circuit contains a capacitor C, a resistor R and a transformer Tr, the secondary winding of which forms the output U1 of the part circuit BF1. The inductance seen from the primary side of this transformer is designated L. The second part circuit BF2 consists of only the resistor r, the resistors R and r being dimensioned so that the resistors of the resistor R is of the order 3–5 times that of the resistor r. If the impedance of the band pass circuit is designated Z the following is valid:

$$Z = R/1 + jQ(f/fo - fo/f),$$

where $Q = 2\pi fo \cdot RC$ and fo = resonance frequency of the parallel circuit = the chosen signalling frequency. Furthermore, the following is valid:

$$\frac{U1}{Uo} = \frac{Z}{r+Z} = \frac{R}{r[1+jQ(f/fo-fo/f)]+r} \quad (1)$$

and $$\frac{U2}{Uo} = \frac{r}{r+Z} = \frac{r}{r + \frac{R}{1+jQ(f/fo-fo/f)}} \quad (2)$$

if in the equation (2) above $f = fo$, then:

$$\frac{U1}{Uo} = \frac{R}{r+R} = \frac{a}{1+a} \text{ where } a = R/r > 1$$

$$\frac{U2}{Uo} = \frac{r}{r+R} = \frac{1}{1+a}$$

Figure 4:
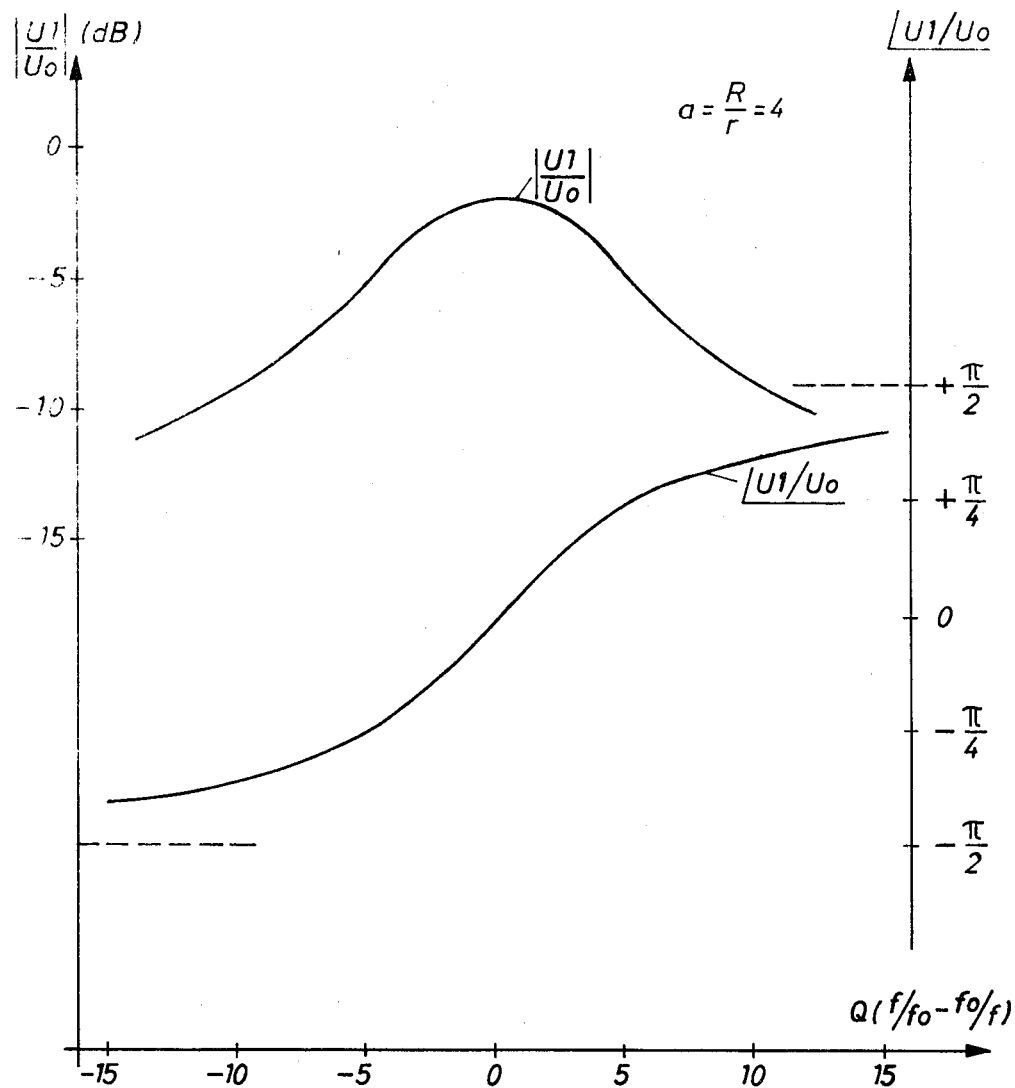
FIG. 4 shows a diagram of the absolute value and the phase angle of the ratio between the input magnitude and the output magnitude of the circuit according to FIG. 3 which shows bandpass character.
Figure 5:
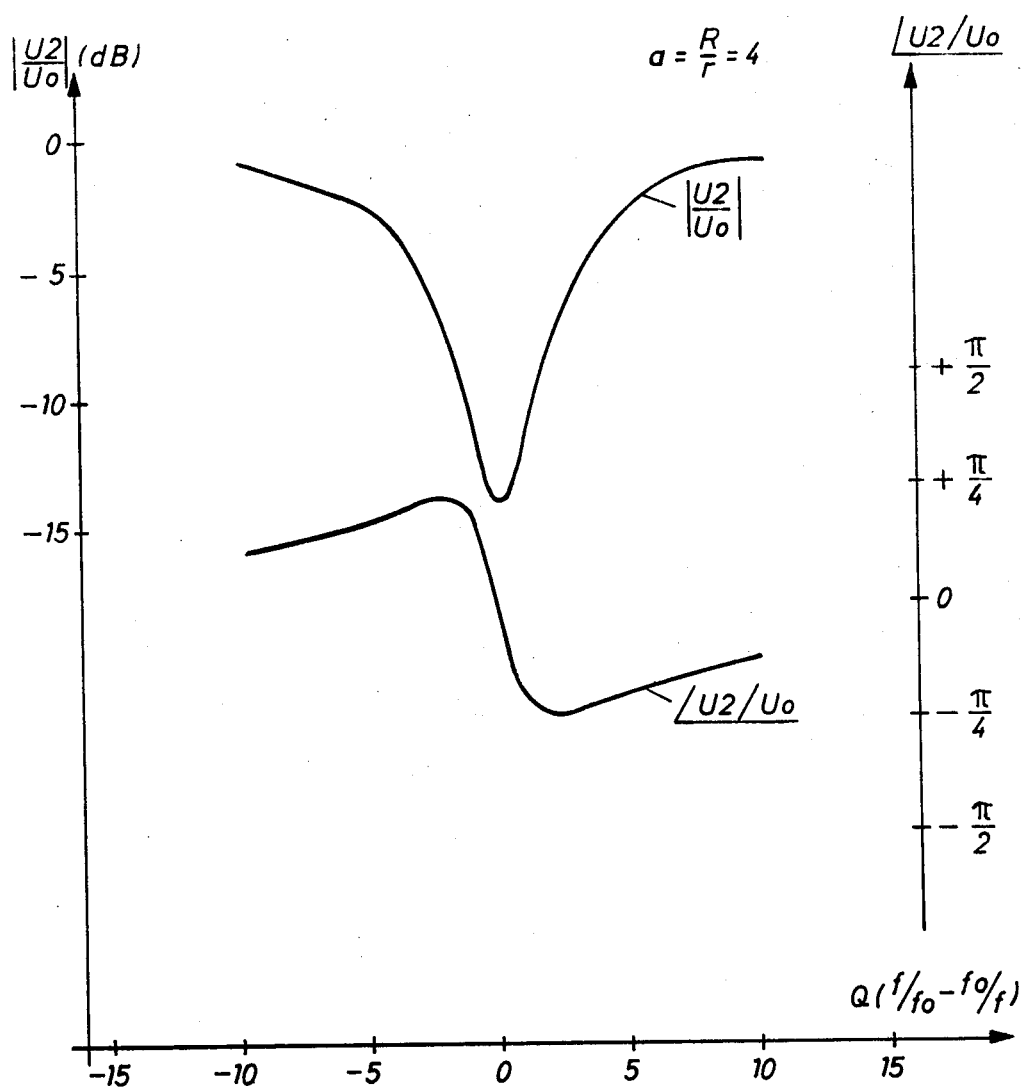
FIG. 5 shows a similar diagram of the ratio between the input magnitude and the output magnitude of the circuit according to FIG. 3 which shows band reject character.

In FIGS. 4 and 5, the waveforms are shown for $a = 4$ which illustrates how the absolute value and the phase shift of the ratio between the signal from the outputs U1 and U2 and the signal to the input Uo varies as a function of the factor $Q(f/fo - fo/f)$. From the diagram according to FIGS. 4 and 5 thus, it is obvious that band pass dcharacteristic can be obtained from the input Uo to the output U1, while band reject characteristic can be obtained from the input Uo to the output U2.

For the outputs U1 and U2 the following is valid:

$$\frac{U1}{U2} = \frac{Z}{r} = \frac{R}{r} \cdot \frac{1}{1+jQ(f/fo-fo/f)}$$

Figure 6:
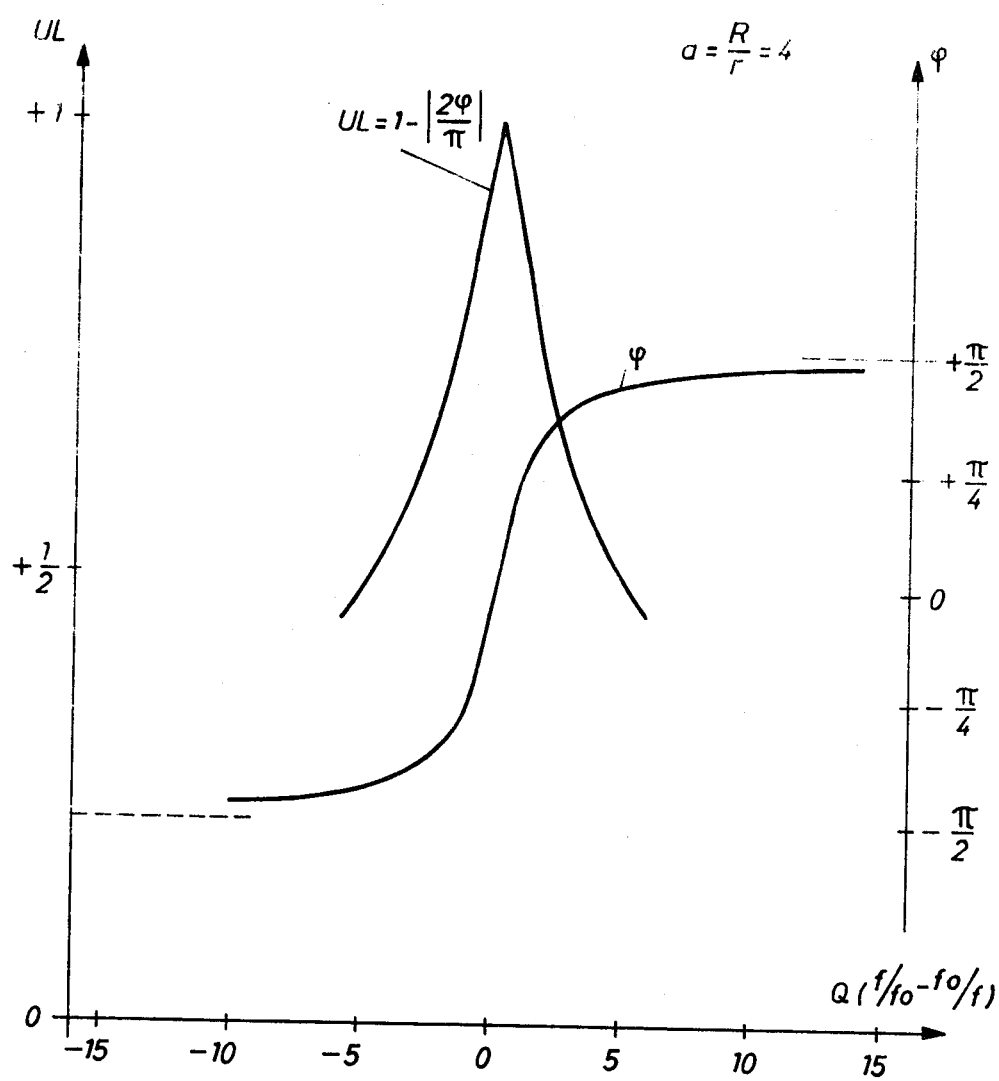
FIG. 6 shows a diagram of the phase difference between said output magnitudes together with the DC-component of an output magnitude which appears in the apparatus according to FIG. 2.

The phase difference $\phi = \arctan Q(f/fo - fo/f)$, which is illustrated in the diagram according to FIG. 6.

The phase difference $\phi$ between the signals across the outputs U1 and U2 thus, is dependent only on the factor $Q(f/fo - fo/f)$. This factor includes the Q-value of the tuned circuit (the parallel resonance circuit) which as known indicates the inverse value of the relative bandwidth (3dB-bandwidth), i.e. the selectivity of the circuit. For an incoming tone signal having a frequency fo equal to the signalling frequency the phase difference zero is thus obtained, while a tone signal the frequency of which differs from fo gives rise to a phase difference $\phi \neq 0$ according to above. A tuned circuit in the filter circuit BF which has a sharp resonant peak, i.e. a high selectivity, has a high Q-value which implies that tone signals whose frequency $f \neq fo$ have a higher value of the phase difference $\phi$ than a tuned circuit with moderate or lower selectivity.

Figure 7:
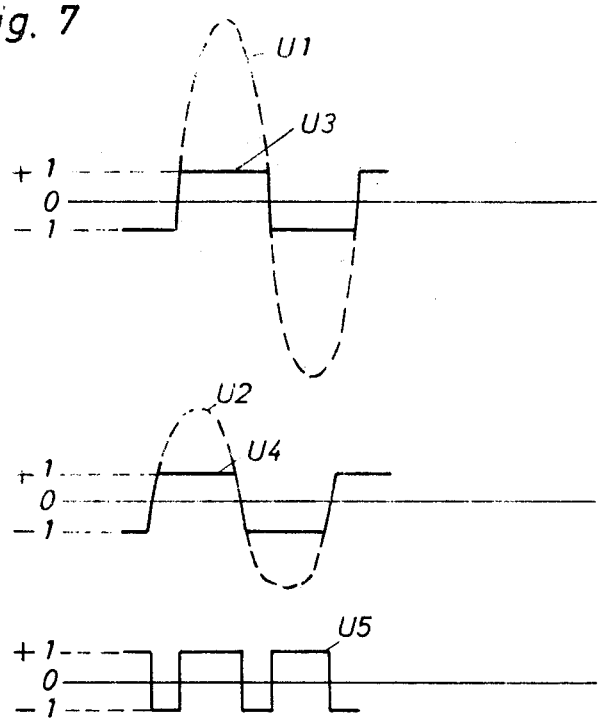
FIG. 7 shows a diagram of certain output magnitudes which appear in the apparatus according to FIG. 2.

In FIG. 7 it is illustrated diagrammatically the signals across the outputs U1–U5 in the case that for only one tone signal with arbitrary frequency within a speech band appears. The signals across the inputs U1 and U2 then can be written as:

U1 = U1o cos wt

U2 = U2o cos (wt+$\phi$), where $w = 2\pi f$

The signal amplitudes are assumed to be so high that the signal after the limiting circuits AD1 and AD2 mainly obtain rectangular shape. Then it is valid that the signal obtained from the output U5 of the product modulator MOD has a DC-component UR which can be written as:

UL = $1/\pi(\pi - /\phi/ - /\phi/) = 1 - /2\phi/\pi/$

The corresponding have form as a function of the factor $Q(f/fo - fo/f)$ is illustrated in the diagram according to FIG. 6 For the tone signals whose frequencies are situated close to the frequency fo it is desirable that the DC-component UL is near 1, so that the incoming signals which are situated within a certain narrow region around the frequency fo also should be accepted. This means that the tuned circuit (the parallel resonant circuit) should have a moderate or a low selectivity. The Q-value thus, should be chosen so that signals near the frequency fo are not accepted. For example, signals within the range $/f-fo/ < 25$ Hz should be accepted, while signals outside the range $/f-fo/ > 75$ Hz should not be accepted.

It is now assumed that two tone signals with the frequencies $wo = 2\pi fo$ and $w1 = 2\pi f1$ appear across the input Uo and that these have the same amplitude. Furthermore, it is assumed that the frequency $f1$ has a value which essentially differs from the value of fo and that the tone signal with the frequency fo is attenuated in the band reject filter BF1. Then the following is valid:

Uo = cos wot + cos w1t and from the outputs U1 and U2 is obtained:

U1 = cos wot + b·cos (w1t + $\pi/2$) where $b<<1$ (band pass output)

U2 = k·coswot + cosw1t where $k<1$ (band reject output)

After limiting in the limiting circuits AD1 and AD2 the signals from the outputs U3 and U4 can be given as:

U3 = A [coswot + b/2.cos(w1t + π/2)]

U4 = A [k/2 coswot + cosw1t]

In the above mentioned expressions for the output signals U3 and U4, the arising harmonics and distortion products in the amplitude limiters have been neglected, since their amplitude values are much more less than the amplitude of the components with the frequency wo and w1.

The DC-component UL of the product U3.U4 can be calculated from the above indicated equations and after calculation it is found that UL = ½. k/2.A². If only one tone signal with the frequency fo appears it is valid that U3 = U4 = A.coswt and UL = A²/2. The ratio between the DC-component UL in both cases thus, becomes equal to the factor k/2, i.e. dependent on the factor k which indicates the suppression in the part circuit BF2 of the signalling tone with the frequency fo. A suppression of 12 dB in the band reject circuit BF1 gives, for example, a factor k = 0.25 and the suppression of the DC-component becomes 18 dB.

Figure 8:
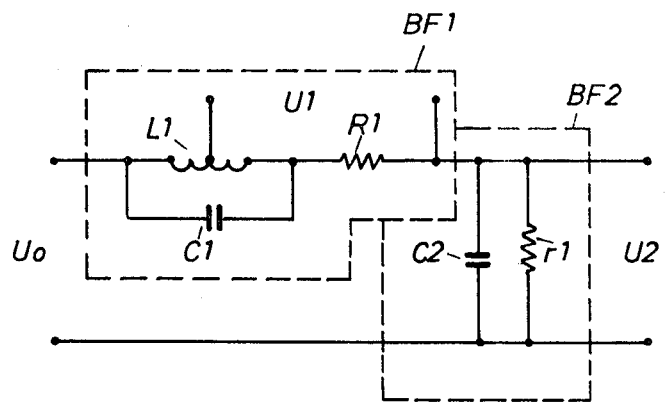
FIG. 8 shows a modified embodiment of the circuit according to FIG. 4 when receiving signals at double-tone signalling.

The apparatus according to the invention can also be applied for double tone signalling between two telephone exchanges. In such signalling it is desired that, in a receiver, one of the signal frequencies is rejected. FIG. 8 shows how the combined filter circuit BF according to FIG. 2 can be designed. The part circuit BF1 consists in this case of the capacitor C1, the inductor L1 and the resistor R1 and the part circuit BF2 of the resistor r1 together with a capacitor C2 connected in parallel with the resistor r1. Across the input Uo a signal appears with the frequencies f1, f2, and it is desired to reject the signal component f1. The parallel resonant circuit in the part circuit is then tuned to the frequency f1. The phase shift between the outputs U1 and U2 is, according to what has been mentioned above, dependent on the factor Q(f/f1−f1/f), i.e. φ ≠ 0 for f = f2. In order that the phase shift would be equal zero for the signal component f2, the capacitor C2 is dimensioned so that an additional phase shift for the signal component f2 is obtained which compensates the phase shift in the part circuit BF1, whereby a total phase shift for the signal component f2 equal zero is obtained.

The combined filter circuit according to FIG. 2 is not limited to the embodiment shown in FIG. 3 with one tuned resonance circuit containing a discrete capacitor and an inductor in discrete performance. The circuit can also be designed using, for example, film techniques of integrated design in order to obtain the desired selection at the wanted frequency of the tone signal. Furthermore, the modulator arrangement according to FIG. 2 can consist of a switch modulator which achieves both the limiting of the two incoming signals and the product modulation of the same.

We claim:

1. Tone signal detecting apparatus for the detection of a signalling component having a frequency situated within the range of a voice frequency band comprising:
    filter circuit means having an input and a first and a second output means, said input being adapted to receive an incoming signal consisting of a number of speech frequency components within said range together with said signalling component, said first output means delivering the signalling component and said second output delivering a suppressed value of the signalling component in relation to the values of the voice frequency components whereby a phase difference of certain value between the signals across said first and second output means is obtained dependent on the frequency deviation of said incoming signal relative to the frequency of said signalling component; signal limiting means for amplitude limiting the signals appearing across said first and second output means; and modulating means for product modulating the limited signals from said limiting means to produce a DC-component which forms an indication of the desired tone signal.

2. Apparatus as claimed in claim 1, wherein said filter circuit means comprises a first circuit having a band pass property at the frequency which is equal to the desired frequency of said tone signal and a second circuit which in combination with the first circuit has a band rejected property at said frequency.

3. Apparatus as claimed in claim 1, wherein said first circuit comprises a parallel resonant circuit having a resonant frequency which is equal to the frequency of the desired tone signal and said second circuit comprises a resistor connected in series with said parallel resonant circuit.

4. Apparatus as claimed in claim 1, further comprising a comparator circuit having a first and a second input, the first input being connected to the output of said modulating means and the second input being connected to a constant signal level for comparing the DC-component with the constant signal level to give an indication of the desired tone signal when the amplitude of the DC-component is greater than the constant signal level.

* * * * *